(12) United States Patent
Swain

(10) Patent No.: US 6,278,952 B1
(45) Date of Patent: Aug. 21, 2001

(54) RELIABILITY GAGE FOR NON-CONTACT AMMETERS

(76) Inventor: William H Swain, 4662 Gleason Ave., Sarasota, FL (US) 34242

( * ) Notice: Subject to any disclaimer, the term of this patent is extended or adjusted under 35 U.S.C. 154(b) by 0 days.

(21) Appl. No.: 09/206,960

(22) Filed: Dec. 8, 1998

(51) Int. Cl.$^7$ .................................................. G01R 19/145
(52) U.S. Cl. ............................................................ 702/64
(58) Field of Search ................................... 324/115, 116, 324/117 R, 126, 127, 142; 702/64

(56) References Cited

U.S. PATENT DOCUMENTS

| | | | |
|---|---|---|---|
| 5,920,197 | * 7/1999 | Price | 324/126 |
| 6,005,383 | * 12/1999 | Savary | 324/127 |
| 6,014,301 | * 1/2000 | Schweitzer | 324/127 |
| 6,043,641 | * 3/2000 | Singer | 324/127 |
| 6,058,354 | * 5/2000 | Adame | 324/142 |
| 6,121,768 | * 9/2000 | Taurand | 324/127 |
| 6,147,484 | * 11/2000 | Smith | 324/142 |

* cited by examiner

Primary Examiner—Patrick Assouad
Assistant Examiner—Khoi Hung Duong

(57) ABSTRACT

A machine, called Reliability gage, for evaluating a non-contact ammeter. Reliability gage outputs at least one of estimated merit reliability, and fault location, and fault assessment of best use of a gaged ammeter. A Reliability gage includes at least one merit measure which has an output indicative of the quality of at least one parameter of the gaged ammeter. A Reliability gage also has at least one reference merit magnitude representative of a "clean" ammeter, that is to say, first rate, or alternatively, a faulted short, faulted gap, etc., and a comparitor with processor and output so that evaluation of the gaged ammeter is done systematically to provide the required output. Reliability gage is applicable to both AC and DC Swain Meter type non-contact ammeters. Some reliability gages are adapted for use by a human operator who may make use of spreadsheets.

17 Claims, 10 Drawing Sheets

RELIABILITY GAGE FOR NON-CONTACT AMMETERS

CROSS REFERENCES

Revised in February 2001

Subject matter herein is, in part, related to U.S. Pat. No. 3,768,011 and application Ser. No. 08/579,395, both by William H. Swain, inventor.

FEDERAL SPONSORSHIP

None

BACKGROUND OF THE INVENTION

We make large and small sensitive non-contact ammeters, mostly clamp-on, called Swain Meter®, to measure DC and/or AC flowing in conductors from #22 wire to 60 inch diameter pipe.

Basic concepts are shown in U.S. Pat. No. 3,768,011: "Means for measuring magnitude and direction of a direct current or permanent magnet, including clip-on direct current sensing inductor".

Improvements (MER Meter and MEC Meter) are described in U.S. patent application Ser. No. 08/579,395: "Error Correction by Selective Modulation".

DC Amp Clips are described on the website of the William H. Swain Co: www.SwainMeter.com Some time ago I received a call from Paris asking about permanent installation of a sensor clamp at the base of a 13 inch pipe on an oil producing platform in a lake in Africa. In effect I declined because of the possibility of unexplained readings at the output of the indicator on the surface. I did not know how to economically find out if the clamp was still working well, or was damaged to where it could not be trusted.

To answer this question, I have discovered, designed and built a machine called Rgage™ for estimating the reliability of a non-contact ammeter by measuring and comparing the merit of its parts with references. Rgage is also useful for improving the quality of new meters, measuring the quality of meters in calibration or service, preferably without seriously disturbing their normal function, and locating and appraising damage should it occur. Hence the name "Reliability Gage for non-contact ammeters", or Rgage for short. The process for making an Rgage machine has been generalized to where it will be useful for ammeters other than Swain Meters.

I use the word reliable in the sense that the Swain Meter can be counted upon to do what is expected—provide an accurate measure of the electrical current flowing in the aperture of the sensor.

This definition of "reliable" is from webster. I am also aware of the science of Reliability assessment, partly in terms of component failure rates, etc. This is outside the scope of my invention. I here use the word "reliable" as I believe was intended by a customer when he said "I think the (newer) MER Meter is much more reliable". He appreciated a dependable, accurate and user-friendly clamp-on ammeter.

Swain Meters have proven reliable—beyond my expectations—even when buried in earth or used subsea. The Rgage has been built for assurance that a specific ammeter is now reliable and is expected to stay that way.

This patent application teaches how to estimate reliability for future use, locate a fault, and assess the present best use of a faulty non-contact ammeter.

Rgage is also for a production quality control tool for a calibration lab or a repair facility. Typical 2 wire in—2 wire out construction facilitates installation and removal.

The Rgage process includes measuring specific merits which are indicative of the quality or value of parts or parameters. An example is the total sensor plus cable DC resistance $\Sigma r_s$. The measurement is preferably automated, with computer control and analysis of the "spreadsheet".

Measurements are normalized and compared for inclusion in a "Rgage spreadsheet" or computer file equivalent. Results are combined, correlated, and processed with design and experience reference files of merit magnitudes representative of a clean or faulty ammeter so as to output estimated reliability, fault location, and assess present use.

SUMMARY OF THE INVENTION

The teaching of this invention is how to build a machine outputting an estimate of: reliability, location of a fault, and best present use of a non-contact ammeter.

The machine is called an Rgage.

To build an Rgage machine, you need:

a) means measuring merits of the ammeter apparatus. Examples are:

$\rho_{v_o}$ in FIG. 3, and $Z_s$ in FIG. 6.

Generally one specific merit measurement result is influenced by the quality or value of several parameters of an ammeter. For example, transfer resistance $\rho_{v_o}$ is changed by an air gap in the sensor core or by an increase in cable resistance.

b) Comparing and reference means so that in a gaged ammeter, a measured merit magnitude can be evaluated by comparing it with a file reference merit magnitude representative of an ammeter in a good "clean" state or a bad "fault" state. And each fault merit magnitude needs to be tagged as representative of a specific fault: "clean", fault short, fault gap, etc. Example of comparison and processing coupled to an output means are shown table 1 for DC and table 4 for AC Swain Meter type non-contact ammeters. These Rgage spreadsheets can be used manually—a person calculates and compares and correlates to get the outputs. Or they can be used as models to specify measurement steps and calculations needed to be performed by a computer with appropriate software, i.e., programs.

The Rgage is useful for gaging the reliability of non-contact ammeter apparatus, especially of sensors which are buried and thus difficult to evaluate by standard methods. It is also useful as a production or laboratory quality control tool—judging ammeter excellence by a lot more than just present calibration accuracy.

Rgage merit measurement is designed to minimize disturbance to normal ammeter use in the field. All this while obtaining numbers representative of at least one and likely several parameters of ammeter sensor, cable, and indicator. This is done with economical and well known tools and implements. For example; the Fluke meters shown in FIG. 1 do a good job at moderate cost, and they are readily available. Moreover, the ammeter can function normally. The use of the Rgage machine does not change the output of the ammeter apparatus. The Rgage in FIG. 1 can be used continually, so it can also be rigged as an alarm to show ammeter malfunction automatically.

Each process for Rgage merit measurement is designed with ease of installation in mind. Most can be installed by separating the cable from the indicator and inserting the Rgage in between. This 2 wire in—2 wire out arrangement is a time saving convenience in quality control—calibration laboratory testing and servicing. This is also true for temporary field service should a buried sensor need calibration verification or damage assessment. Moreover, it is a labor saver when adding an Rgage to the internal part of an indicator. There is no need to position an Rgage outside of the indicator.

DESCRIPTION OF THE DRAWINGS

The teachings of this invention are illustrated and explained with the aid of drawings and tables which describe examples of Rgage machines, and also processes for making one or another form of Rgage machine.

In FIG. 9, "Ready" merit lamp is on when basic parameters of sensor, cable, and indicator are, to first order, adequate. This shows that the DC Swain Meter is likely reliable, at least for first order measurements.

In FIG. 1, the loop current $i_s$ has components reactive "j" and dissipative "d". They are measured to get merits of loop current $i_s$. This infers the value of some parameters of the sensor, cable, and indicator. By comparing and processing these merits with file references merit magnitudes from design and previous measurements from the same or similar Swain Meters, we get a reliability estimate for this meter.

Figure 1:
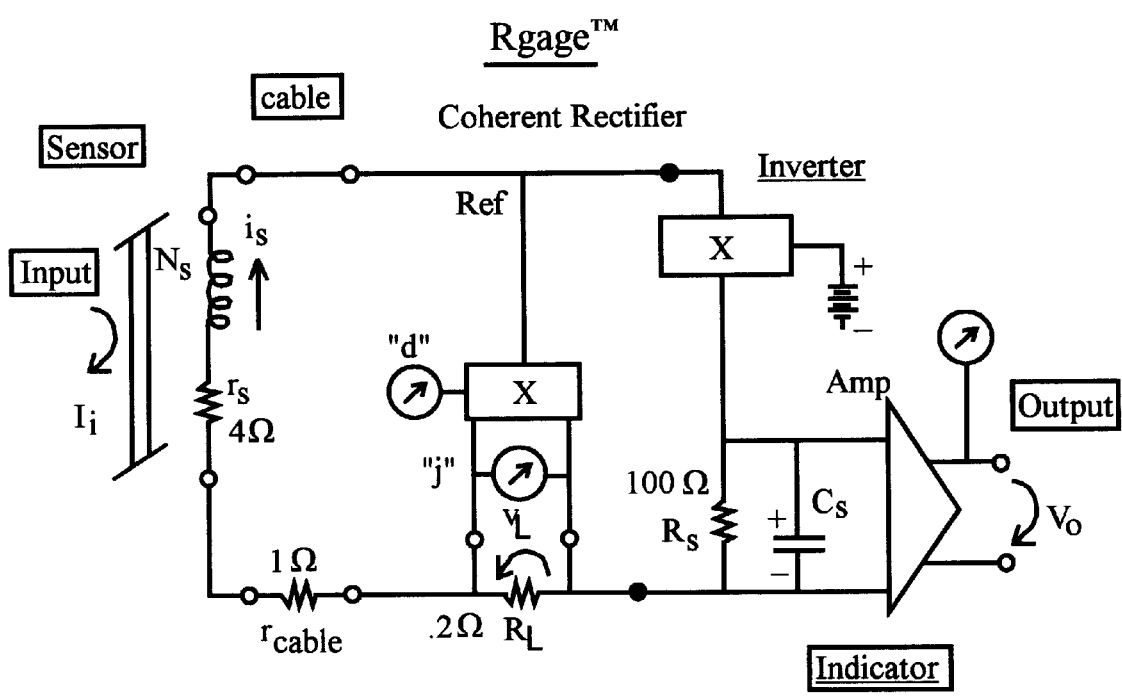
FIG. 1 outlines a merit "d" (dissipative) and also merit "j" (reactive) Rgage connected in series—parallel with the cable of a DC Swain Meter type ammeter without disturbing its operation. These merits can be measured continuously, and could function as input to an automatic malfunction alarm.
Figure 1B:
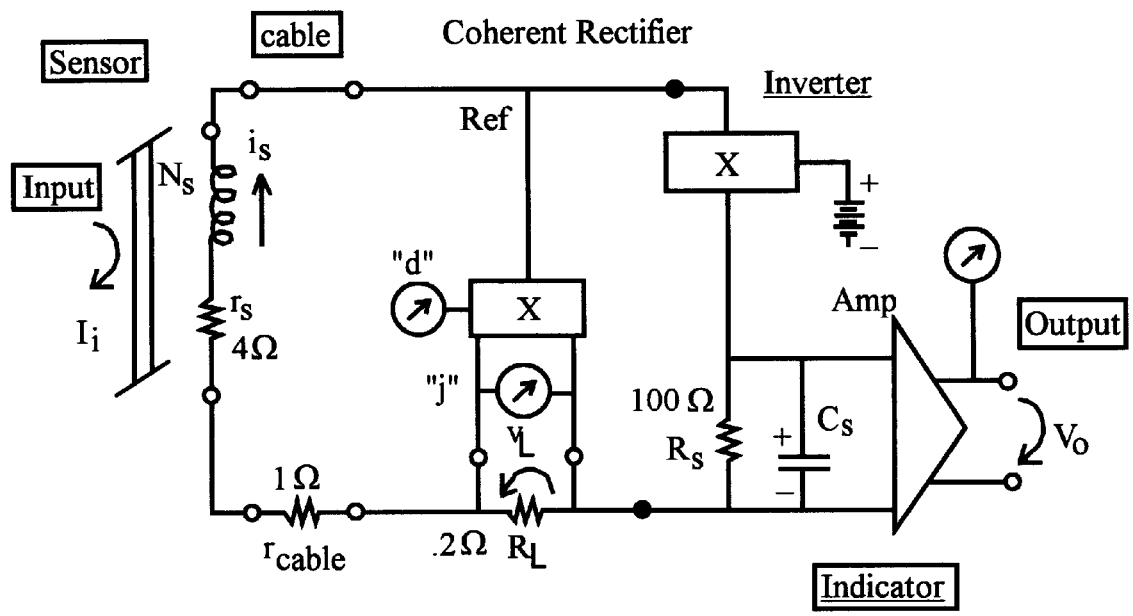

The Rgage in FIG. 1b has "j" and "d" are merits of loop current $i_s$. These infer the value of some parameters of the sensor, cable, and indicator. They are used to get a reliability estimate for this Swain Meter.

Figure 2:
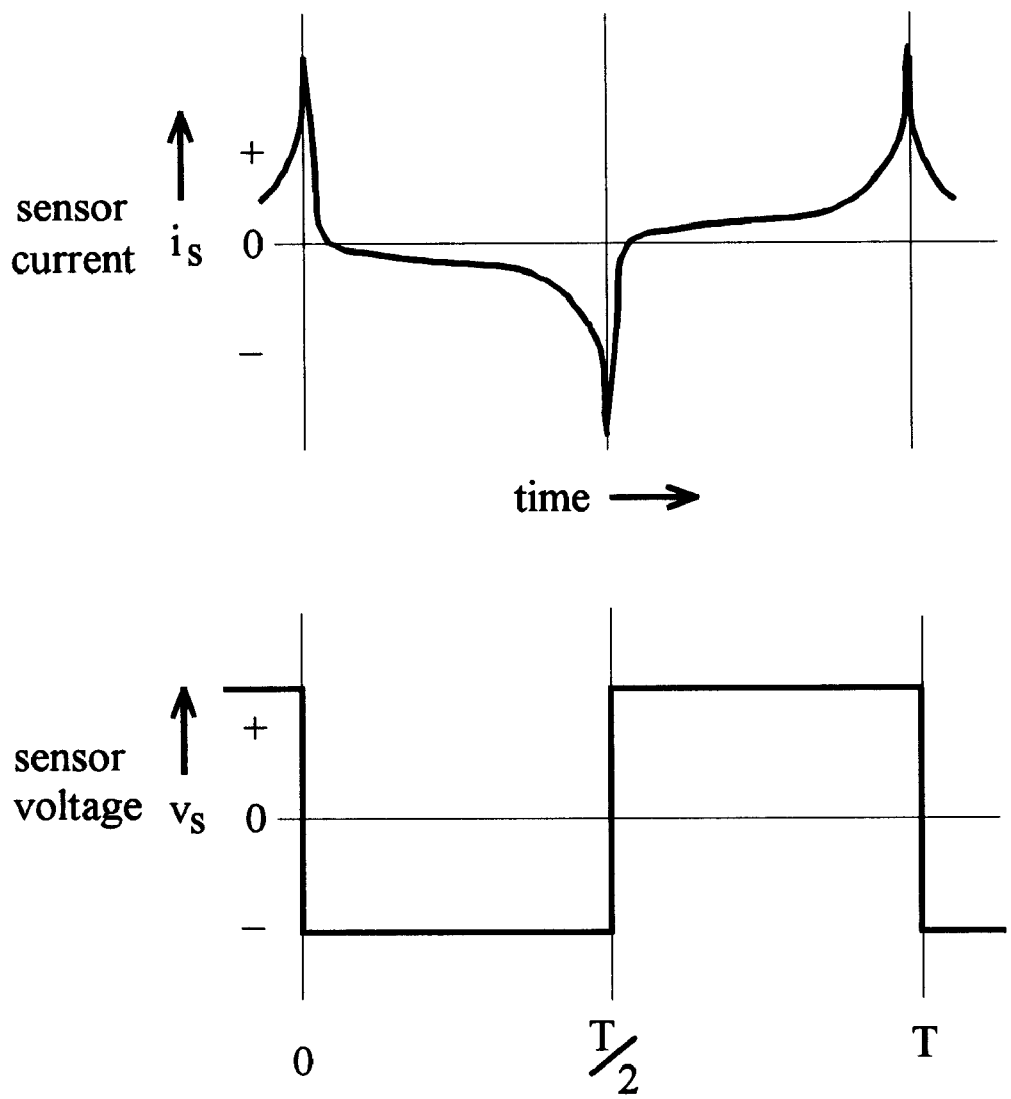

FIG. 2 portrays the waveforms of sensor current $i_s$ and sensor voltage $v_s$ for a DC Swain Meter. FIG. 2 is an illustration of the waveform of sensor current $i_s$, together with the waveform of the sensor's voltage $v_s$.

Figure 3:
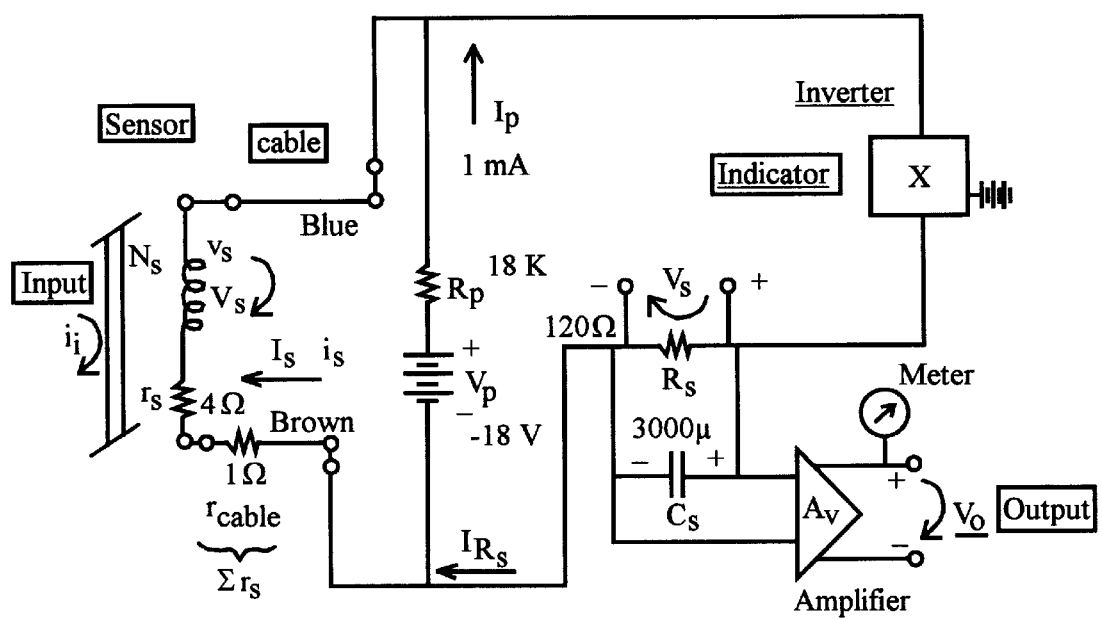

FIG. 3 outlines a method for measuring merit $\rho_{v_o}$. This is a gage of the value of parameters in both the sensor and the indicator in a DC Swain Meter. In FIG. 3, the shunt current $I_p$ injected across the indicator terminals to the sensor via the cable produces an inverter output $v_o$. The ratio $$\frac{\partial V_o}{\partial I_p} = \rho_{v_o}$$

is a merit, typically showing the efficiency of the sensor and indicator. Shunt current $I_p$ also causes indicator input current $I_{R_s}$ to flow. Typically sensor Reliability Factor is high when $I_{R_s}$ is just slightly larger than $I_p$.

Figure 4:
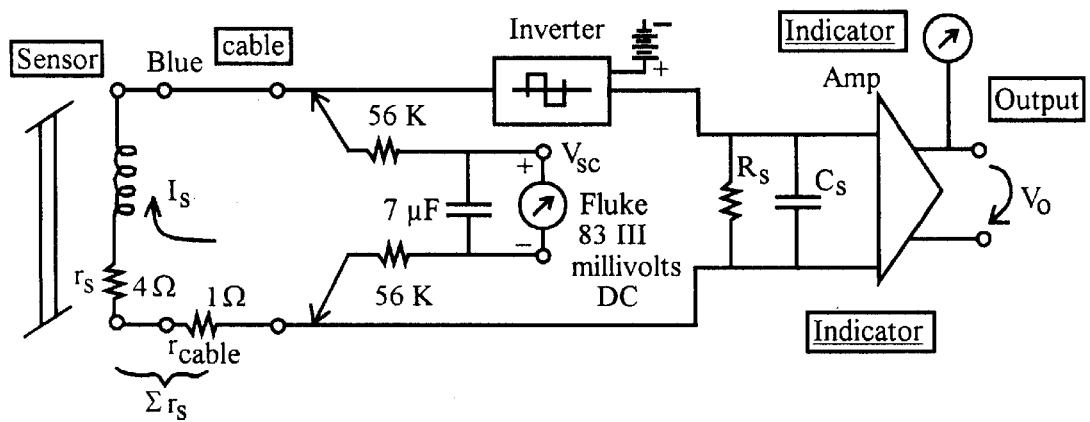

FIG. 4 illustrates a method for measuring the average DC voltage $V_{sc}$ across the sensor of a DC Swain Meter. FIG. 4 considers sensor voltage and current. Sensor average DC voltage $V_{sc}$ can be less than 1 millivolt. It is measured using a low pass filter to keep most of the 12 volt square wave $v_s$ from the inverter to the sensor out of the millivoltmeter measuring $V_{sc}$. When the parameters $r_s$ (sensor resistance) and $r_{cable}$ (cable resistance in both wires) are known, or their sum $\Sigma r_s$ is directly measured, the sensor current $I_s$ is $$I_s = \frac{V_{sc}}{\Sigma r_s}.$$

Table 1 is an Rgage spreadsheet. It outlines a process for getting DC Swain Meter Reliability Estimate as a function of merit derived from parameter fault. Table 1 is key to organizing merit measurements, correlated with fault types, for comparing and combining to get estimated future reliability, fault location, and to assess best present use. It outlines Rgage comparison and processing to be performed by a person, or preferably by a computer with appropriate programming, i.e., software and output apparatus.

Table 1 is an Rgage spreadsheet for DC Swain Meter reliability estimate as a function of merit derived from parameter fault. It includes the product of reliability factors.

Table 1a is a DC Rgage spreadsheet for DC Swain Meter reliability estimate as a function of merit derived from Parameter fault. It includes the parameter $\alpha$.

Table 2 is a part of table 1 arranged for demonstrating the function of the Rgage machine to locate a fault in a DC Swain Meter type non-contact ammeter.

Table 3a and table 3b illustrate the fault assessment functioning the Rgage: ranging in complexity from manually operated Fluke model 83 III to 87 III with Rgage spreadsheet and hand calculator to machine driven merit measurement gear and computer for managing the equivalent of the spreadsheet table 1 as well as the processing of tables 3a and 3b.

Figure 5:
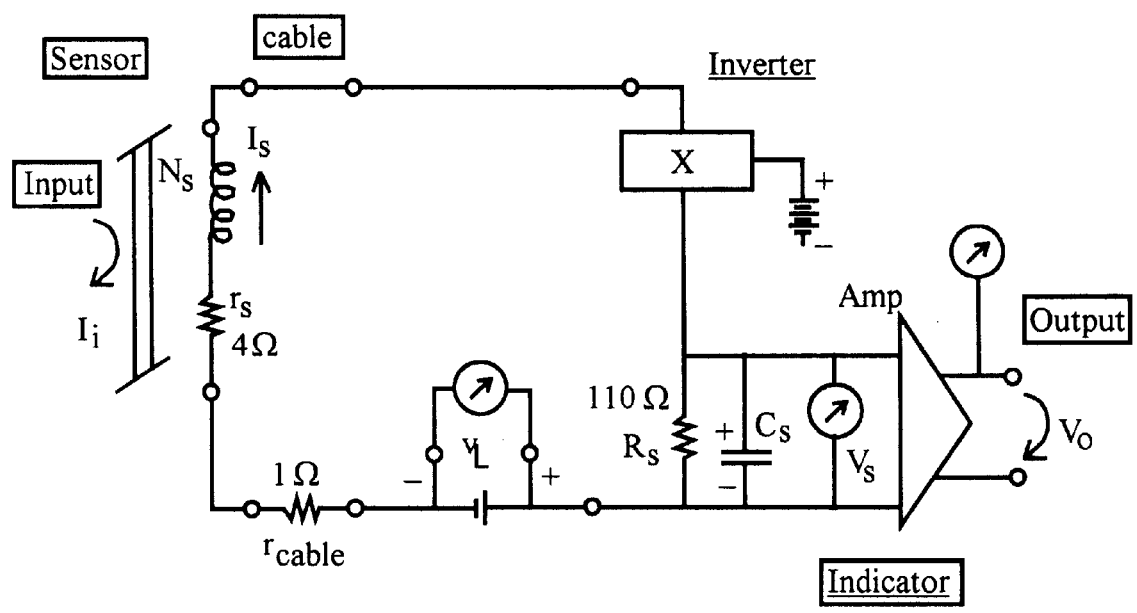

FIG. 5 illustrates the use of merit $\alpha$ which is influenced by the quality of some sensor and indicator parameters.

FIG. 5 shows a Series Injection Rgage™. A voltage $V_L$ being injected in series with the $I_s$ loop is illustrated. For MER DC Swain Meters $V_L$ can generally be zero plus or minus 0.1 to 2 volts DC. A single alkaline cell is one way to provide $V_L$ at a very low impedance. I discovered that the output $V_o$ is more positive when $V_L$ is more positive. Output $V_o$ is greater when some sensor parameters have less quality.

Figure 6:
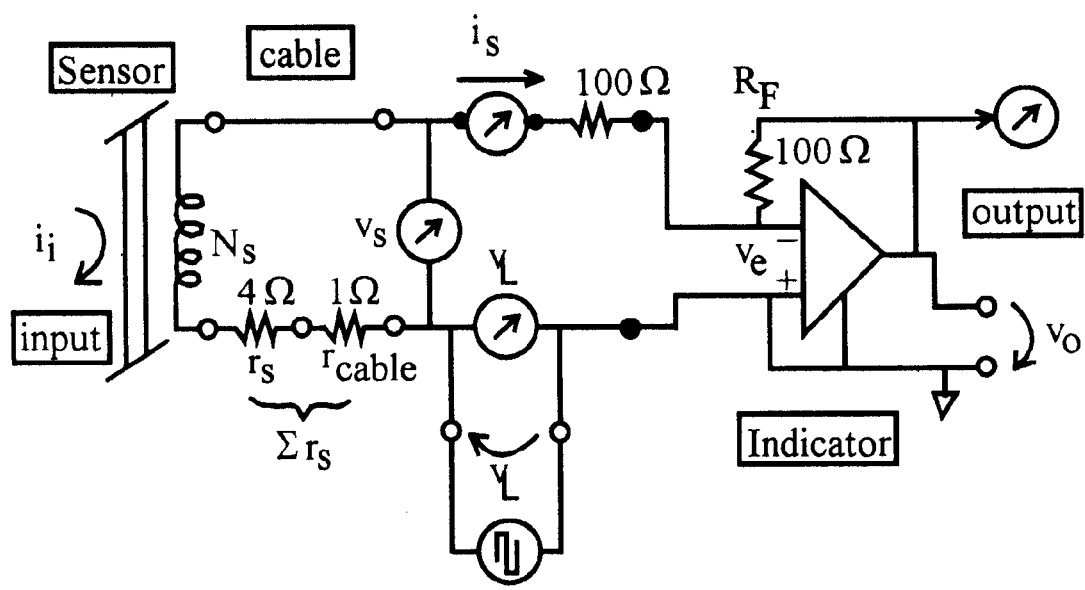

FIG. 6 portrays a series method for measuring merit $Z_s$ in an AC non-contact ammeter. Merit $Z_s$ is largely influenced by the quality of the sensor.

FIG. 6 is an AC Rgage™. FIG. 6 illustrates a series Rgage. Square wave voltage $v_L$ is injected in series with the sensor current $i_s$ loop so that a current $i_s$ flows to the indicator. The source impedance of $v_L$ is low, and the frequency $f_L$ approximates the operating frequency.

A merit of the sensor is its impedance $Z_s$ which is called sensor voltage $v_s$ divided by sensor current $i_s$.

$$\text{Merit } Z_s = \frac{v_s}{i_s}.$$

Ideally the sensor core parameter V is large, $N_s$ is substantial, and $r_s$ is small. If in addition other losses are small, the impedance parameter is mostly inductance. The ratio of loop current $i_s$ to loop voltage $v_L$ is called merit $\sigma_L$.

$$\text{Merit } \sigma_L = \frac{i_s}{v_L}.$$

Ideally $Z_s$ is large so $i_s$ is small. Thus sensor and cable parameters have high value when merit $\sigma_L$ is small and merit $Z_s$ is large.

Figure 7:
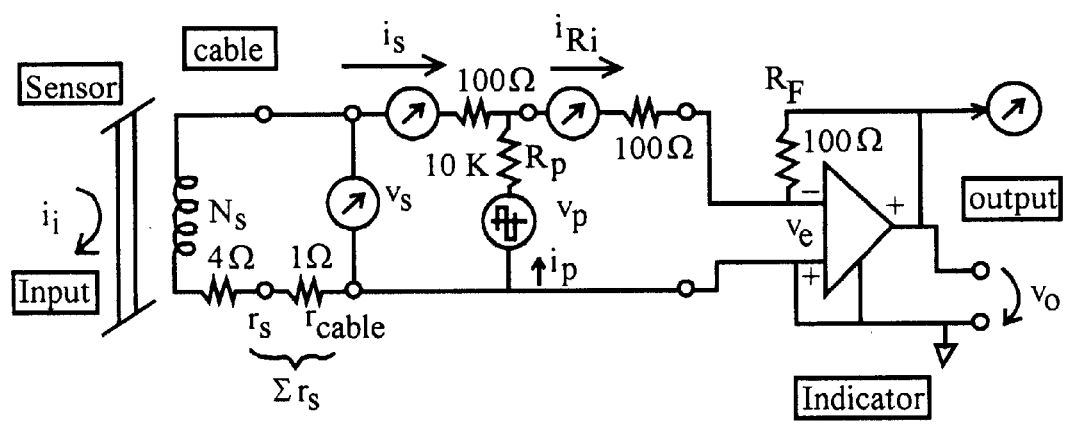

FIG. 7 illustrates an AC shunt method for measuring merit $Z_s$ which is largely set by the sensors inductance.

FIG. 7 is a Shunt Injection AC Rgage™. FIG. 7 illustrates a shunt Rgage. Current $i_p$ is injected across the cable so that some $i_{R_i}$ flows into feedback resistor $R_F$ and some $i_s$ flows into the cable and on to sensor winding $N_s$. Shunt resistor $R_p$ and voltage $v_p$ are large.

We call the impedance of the sensor a merit $Z_s$, and its measure $$\text{Merit } Z_s = \frac{v_s}{i_s}.$$

Ideally the sensor core parameter permeability $\mu$ is large, $N_s$ is substantial and $r_s$ is small. Then when other losses are small the impedance parameter is mostly a large inductance. The frequency $f_p$ of square wave source $V_p$, is similar to the usual operating frequency. Ideally the current $i_s$ in the sensor due to shunt stimulus current $i_p$ is small, so $$\text{Merit } \beta_{ac} = \frac{i_s}{i_p}$$

is much less than 1 when sensor parameters are favorable.

Another merit is $\Sigma r_s$. To find the measure of merit $\Sigma r_s$, i.e., the total DC resistance of sensor ($r_s$) and cable ($r_{cable}$), I pull the cable connector off the indicator, and use a Fluke 83 III to measure ohms DC.

Figure 8:
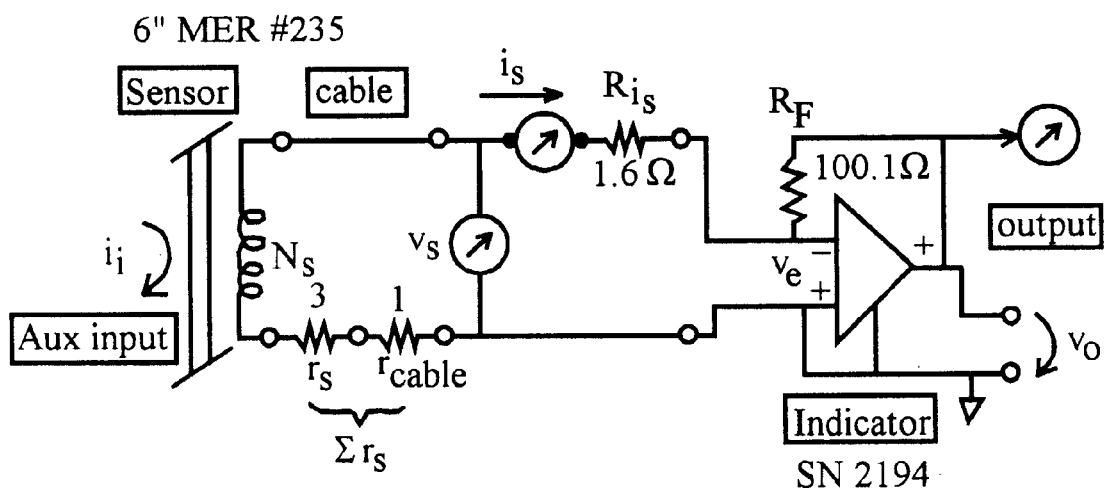

FIG. 8 diagrams an auxiliary current input Rgage for finding merit $\rho_o$. This is the basic non-contact ammeter transfer resistance: output voltage $v_o$ divided by input current $i_i$.

FIG. 8 illustrates an Rgage using an auxiliary current $i_i$ input linking the core of the sensor.

One or more auxiliary input turns are wound on the core of the sensor before burial and likely brought to the surface along with the cable. A square wave current source is connected and used to drive a signal current to the sensor. The resulting output voltage $v_o$ is measured.

$$\text{The merit } \rho_o = \frac{v_o}{i_i}$$

is the output $v_o$ divided by the input ampere turn product $i_i$.

Table 4 is an Rgage spreadsheet adapted to an AC non-contact ammeter. It can be for a Swain Meter, or it can work with other types of non-contact ammeters. It outlines what is to be done by a person with portable instruments and an Rgage spreadsheet; and the method needed for inclusion in the computer hardware and software of an AC Rgage machine.

Table 4 is an AC Rgage spreadsheet. It includes AC Swain Meter reliability estimate as a function of merit derived from parameter fault.

DESCRIPTION

An Rgage is a machine having as an output at least one of estimated reliability, fault location, and fault assessment. What can be in an Rgage, how to make it, and how it functions to output likely reliability, fault location and best present use of a non-contact ammeter follows.

The drawings, tables, and accompanying discussion use illustrative examples taken from DC Swain Meter type non-contact ammeters; and also AC. However the merit measurers, plus references, comparitor and processor illustrated in the spreadsheet are broad, applicable to other types of non-contact ammeters.

Some Rgage forms are simple and non-intrusive. The merit measurement can be used continually without disturbing the normal function of the ammeter. The output can be used to activate a malfunction alarm.

Other Rgage forms are more complex and so use a computer with suitable programming software to run through a series of merit measurements and then process the results to output more detailed reliability estimates, fault location, and best use assessment in which the user can be more confident.

Structure and functioning of several types of Rgage machine are diagrammed in the drawings and tables. They are examples of the Rgage concept applied to Swain Meter type non-contact ammeters. With the adjacent discussion the reader can learn what is in an Rgage machine, how to build it, and what functions are performed.

This is for several kinds of merit measurer with a merit output. It is also for representative merit magnitudes to be used as references—a bank of numbers with which to compare a merit output so as to decide whether the merit output is likely from a "clean" (first rate) ammeter, or a faulted by gap, or a faulted by short ammeter, etc. It is also for the comparitor, processor and output functions of the computer as diagrammed in the tables.

INTRODUCTION

This patent application teaches a gage showing estimated reliability, fault location, and fault assessment for best use of a non-contact ammeter.

To begin, merit measurers are constructed with outputs indicative of the quality of parameters of the ammeters parts: Merits of the gaged ammeter are compared with reference file merit magnitude counterparts representative of a similar, but "clean" ammeter, i.e., an ammeter made of fine materials using best processes and qualified as first rate after test and evaluation.

The comparitors normalized merit outputs go to a processor which combines the gaged ammeters merits with weighting factors to output an estimate of future reliability.

When an output is poor, i.e., below a standard, the decider starts a fault location process. A fault locator assembles the gaged ammeters merits together with a reference file matrix of merit magnitude representative of a similar ammeter, but tagged as characteristic of a specific fault. Examples are "gap" in sensor core, partial "short" of sensor; excess cable resistance; and defective indicator.

The fault locator systematically correlates gaged ammeter merits with reference file fault merit magnitudes to find the likely type of fault.

If the user of the ammeter can clear the fault (for example, replace a bad connector or swap out a defective indicator) the decider starts a rerun of the "clean" comparison. When the gaged ammeter exceeds "good" threshold the gaging is finished.

On the other hand, if the fault locators output points to a partial sensor short at a time when the sensor is buried in frozen earth, the user may delay clearing the fault. The fault assessor process starts.

In fault assessment mode the user is to be informed by the output means of the present probable best use of the gaged ammeter. To do this a proportional comparitor weighs the gaged ammeter merits and also the corresponding "short" reference merit magnitude. These have been tagged with characteristic erroneous performance.

For example the change in gain on all three operating ranges is less than 1% when merit "d" is less than 30 $\mu$A. The zero offset change can be +55 mA, but this is tagged "soft"—it could as well be ±300 mA.

So the fault assessors readout is likely ±2% accuracy in measuring interrupted current on any range. For steady currents the added zero offset uncertainty is ±300 mA.

Figure 9:
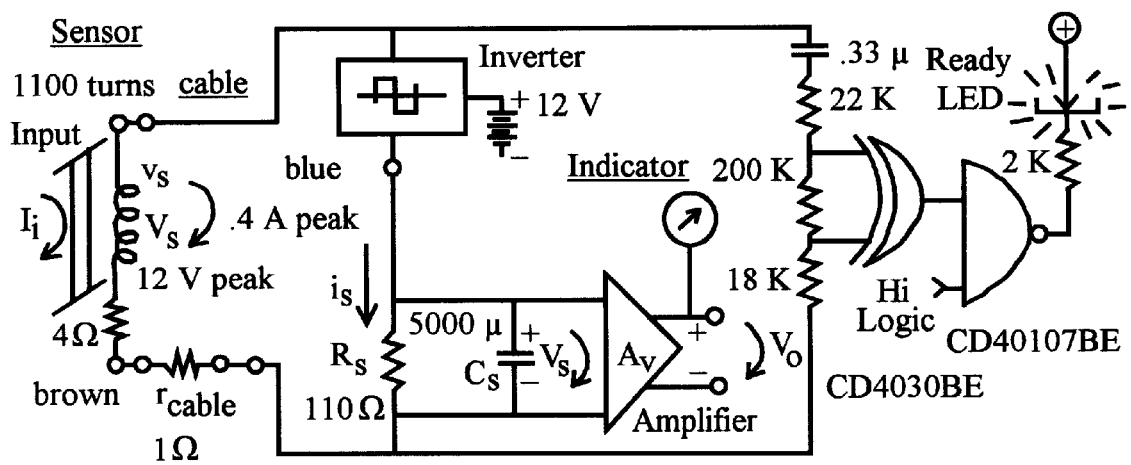
FIG. 9 outlines a "Ready" lamp for showing when a DC Swain Meter type ammeter is set for reliable measurement. Some parameters in the sensor, cable, and indicator must be more or less within normal bounds for the "Ready" lamp to come on. It can be connected continuously directly across the cable without disturbing normal ammeter operation.

For making an Rgage, basic, series, and shunt injection merit measurers are diagrammed in FIGS. 1 and 3 thru 8. FIGS. 6, 7, and 9, and also table 4 illustrate examples of Rgages for AC non-contact ammeters. They are applicable to both Swain Meters and other AC types.

Merit measurers are described for DC non-contact ammeters, especially for Swain Meters. Comparitor, fault locator, processor, combiner, correlator, decider, and fault assessor processes for an Rgage are done manually, especially when following table 1 and table 4 with associated discussion. Or the work is shared or largely done by a computer equipped with a program (software) to execute the steps diagrammed in the tables and illuminated in discussion.

"Ready"

FIG. 9 is an example which illustrates a Reliability Gage machine (Rgage™) for a DC Swain Meter type clamp-on ammeter. The merit measurer has an output which is responsive to several parameters of the ammeter. It is a combined parameter merit form of Rgage in that the "ready" light will only be on if the sensor and the cable and the indicator are functioning normally, at least to the first order.

Consider each part:

The CD4030BE exclusive OR will go to logic "Hi" if its' two logic inputs substantially differ. When $R_sC_s$ are okay and the inverter output is normal—about 100 Hz square wave at 12 Volts peak—the two logic inputs will be at different logic levels. However, if the inverter faults to run at either a high frequency (10,000 Hz) or small amplitude (4 Volts), or if $R_sC_s$ fail open, then the Exclusive OR inputs will be logically similar and the "ready" lamp will go off.

The input logic level thresholds plus the resistor and capacitor values act as a virtual memory file reference for comparison with the magnitudes of the inputs.

The inverter will cease normal output if its parts have a major parameter fault; or a sensor having okay merit is not connected across its terminals (through $R_sC_s$); or it is shorted—even momentarily.

Thus severe damage to the sensor; or a cable open; or a cable short, even momentarily, or some type of indicator fault, will halt the inverter's normal function, and turn the "ready" light off. This output signals that the Swain Meter apparatus is not reliable until the fault is cleared—perhaps simply by turning the power off and then on again.

So this "ready" light form of Rgage measures the merit of the parameters of the sensor combined with the inverter plus $R_sC_s$ and the cable, and uses this to output a reliability signal.

A Simple Rgage.

The simple reliability gage example in FIG. 1 illustrates how to measure two merits. These can be compared with merit magnitudes in a file reference and the results processed to obtain estimates of fault location and fault assessment—i.e.,—how much worse is gain accuracy and zero offset error. A reliability estimate is also provided. It says how likely the ammeter is to dependably measure current within 5% accuracy for another year.

For example, we know from file data that merit "j" is more sensitive to a sensor core reluctance parameter increase. This is likely an "air" gap in the core of a Sea Clip fouled by an oyster during use by a diver to measure subsea current. Therefore if merit "j" reads well above file we estimate the fault to be located in the sensor—namely a "gap" in its core.

We also know from reference data that merit "d" is more sensitive to power loss. This can be due to shorted turns in the sensor, bare cable in salt water, excessive cable resistance due to defective connectors or improper construction, or a defective indicator. Therefore if merit "d" reads well above file, we estimate the fault to be located where power can be lost due to resistance.

Likely error can be estimated from other file locations. Merit "d" readings well above file generally are associated with acceptable gain accuracy—especially in the 20 Amp and 200 Amp ranges. So accuracy of measurement of a current over 2 Amp can be acceptable, especially if the current is interrupted.

Therefore if merit "d" reads well above file the magnitude of damage is assessed as likely tolerable if measured current is greater than 2 Amp and interrupted.

Similarly, the magnitude of damage if merit "j" is well above file is assessed as likely tolerable if the current is interrupted—even on the 2 Amp range. A file search shows that gain is likely not much in error when merit "j" reads double.

This shows that the simple "j" "d" Reliability gage in FIG. 1 outputs $i_s$ merit measurements leading—by comparison with a file of previous or design measurements—to reliability factors, plus showing the likely location and assessment of parameter degradation due to a fault.

Peak to Average

Sensor merit is also shown by measuring the peak "$j_p$" to average "$j_a$" ratio of sensor current $i_s$. The ideal sensor resembles a fine toroid core inductor in that the $i_s$ waveform (see FIG. 2) shows $i_s$ equal to near zero during most of a half-period ($T_1$ or $T_2$), and then rapidly increasing to peak magnitude in a very short time. The unit impulse is an analogy.

Peak to average can be measured with a variety of tools. One convenient way to approximate the measure is to expand the method for measuring merit "j" in FIG. 1. To get a practical version of peak to average, read "$j_p$" with a true rms meter (Fluke 87 III) and "$j_a$" with the usual rms proportional—to—average Fluke 83 III.

$$\text{Merit } S = \frac{\text{``}j_p\text{''}}{\text{``}j_a\text{''}} = \frac{\text{``rms''}}{\text{``average''}}.$$

This largely shows sensor "squareness." It also generally shows that the indicator's inverter is functioning properly. High value, i.e., high reliability factor, go with a high merit S measurement.

The following review of the simple Reliability gage illustrated in FIG. 1 has more quantitative information, and is from a slightly different perspective.

A Simple Reliability Gage.

FIG. 1b shows a simple Reliability gage for a DC Swain Meter. Sensor current $i_s$ flows in loop resistor $R_L$—often 0.2 Ω—producing voltage $v_L$ proportional to $i_s$.

In FIG. 1b the reactive "j" component of $i_s$ and the dissipative "d" component of $i_s$ are the quantities measured to get merits for $i_s$. Merit "j" and merit "d" are compared with corresponding file references to get reliability factors. These imply a value for each of Swain Meter parameters: sensor, cable, and indicator. Combining reliability factors gives a reliability estimate.

Typical waveforms for $i_s$ and $v_s$ are shown in FIG. 2.

A MER™ type Swain Meter with a 6" MER Sea Clip® having high reliability factors will have "j" merit of about 8 mV rms average, and "d" merit about 13 microamp DC. The "d" load is a 100 ohm microammeter Fluke model 87 III.

For measuring "j" we use the Fluke 83 III meter because it does not read true rms, but proportional to average.

The part of sensor current $i_s$ which represents dissipated ("d") power in all the parts of the loop wherein sensor current $i_s$ flows is proportional to the correlation product $$"d" = k i_s \cdot v_s.$$

This is sometimes called a coherent rectifier. Another way of saying this is:

$$i_s(d) = \left(\frac{k}{T_1 + T_2}\right) \left\{ \int_0^{T_1} i_s \, dt - \int_0^{T_2} i_s \, dt \right\}$$

where $T_1$ is for $+v_s$; and $T_2$ is for $-v_s$, and
k is a proportionality constant of the rectifier.

If "j" and "d" merit readings are much less than 8 mV and 10 μA it means low reliability. The inverter may have entered a forbidden state, or the cable may be broken.

An air gap in the jaws of the 6" clip causes the merit "j" to increase from 8 to 16 mV; i.e., double. The merit "d" is less affected—merit "d" changes from 13 μA to 19 μA due to the same air gap—a 1½ to 1 increase. A sensor core reluctance change shows up mostly in merit "j".

On the other hand, a 20 ohm increase in sensor, cable, or connector series resistance only increases "j" merit from 8 to 9 now a bit more than 10%. However, merit "d" about doubles. Resistance dissipates power when a current flows. The merit "d" increased from 13 to 30 μA—a 2.3 to one increase.

Merit "d" also increases due to the shorted turn effect of a metal U bolt holding a clamp; or:
clamp damage which shorts some turns in the clamp winding; or
damaged cable insulation in salt water; or
fail open $C_s$, or
lossy inverter fault in the indicator.

Resistance coupled to the sensor, cable, indicator loop, in series or in parallel, generally dissipates power and mostly increases the merit "d" reading.

Shunt Injection Rgage™

FIG. 3 shows how sensor, cable and indicator parameter condition can be inferred by merit $\rho_{v_p}$ measured when injecting a small DC current $I_p$ across the indicator terminals which connect to the sensor via the cable. The battery $V_p$ is 18 Volts and the resistor $R_p$ is 18,000 ohms so that $I_p$ is a 1 mA current source that has high compliance.

When merits of a MER™ sensor, cable and indicator having superior parameters are measured as in FIG. 3, most of the current $I_p$ flows in the indicator loop. Here $I_{R_s}$ is the current in the input of the indicator—parallel connected 110 ohm resistor $R_s$ and 3000 μF capacitor $C_s$. Then input voltage $V_s$ is:

$$V_s = I_{R_s} \cdot R_s.$$

Since the gain $A_v$ of the indicator's amplifier is $$A_v = \frac{V_o}{V_s}, \quad V_o = I_{R_s} R_s A_v.$$

Loop current $I_{R_s}$ can be measured directly by inserting a meter (Fluke 83 III) in the line but the 100 burden in the μA scale may change the current $I_{R_s}$. Also, the meter should be shunted by a capacitor like $C_s$—3000 μ–16 V.

Loop current $I_{R_s}$ can be measured indirectly by measuring output $V_o$ if input resistor $R_s$ and amplifier gain $A_v$ are in the file. Then:

$$I_{R_s} = \frac{V_o}{R_s A_v}$$

If merit is very high and essentially all of $I_p$ flows in the $I_{R_s}$ indicator loop, then the average (DC) current in the sensor $I_s$ is essentially zero. On the other hand, if merit is reduced, for instance, by parameter changes due to:
a gap in the sensor lips,
high cable resistance,
a partially open $C_s$ at the indicator,
a shunt load of the cable or clip, etc.;
then the sensor draws average current $I_s$ in a polarity which increases $I_{R_s}$ so that it is now noticeably greater than $I_p$. Average sensor current $I_s$ is known from:

$$I_s = I_{R_s} - I_p$$

We designate the ratio of average sensor current $I_s$ to test current $I_p$, the merit "β", by the symbol "β". So $$"\beta" = \frac{I_s}{I_p}$$

There is another way of finding average sensor current $I_s$ if inverter parameters $R_s$ and $A_v$ are not in file. However it is less accurate unless sensor current $I_s$ is greater than 0.1 mA.

Sensor average (DC) voltage $V_{sc}$ is measured as shown in FIG. 4. The parameter sensor plus cable resistance $\Sigma r_s$ can be directly measured. Or is separately known:

$$\Sigma r_s = r_s + r_{cable}.$$

Then sensor average current $I_s$ is:
Then sensor average current $I_s$ is:

$$I_s = \frac{V_{sc}}{\Sigma r_s}$$

The effect of merit β is like regeneration. When loss or reactive current is great in the sensor, cable, and indicator loop, the apparent sensor gain generally increases. This is seen as greater output $V_o$ per test milliampere $I_p$.

Rgage Spreadsheet—Table 1

Table 1 correlates 5 merit magnitude measurements on a 6" Swain Meter with 5 types of fault state: "clean", gap, short, plus 10 and 20 ohm added $R_{cable}$. It is an illustrative example of an Rgage™ comparitor and processor: a spreadsheet model for a computer program or software to go with the machine hardware in FIGS. 1, 3 and 4. The output is the estimate of reliability of a DC Swain Meter ammeter; both "clean" and "faulted". Merit magnitudes are obtained using the machine's electrical tools (coherent rectifier, Fluke meter, MER meter, MER sensors, etc.).

The Rgage machine and Table 1 type software are also used to locate a fault. In addition, they are used to assess the consequences—damaged accuracy—etc. For accuracy assessment to show best use I have added gain and zero offset error on the meter.

The Rgage machine user can get insight as to whether he can at least somewhat trust the apparatus readings of current. For instance, use of the 20 A range to measure 10 A likely is more accurate than using the 2 A range to read 0.1 A.

In addition, the user can get a clue as to how to find and fix the fault. For example, if the merit measurements of the present Swain Meter generally agree (correlate closely with) file merit measurement magnitude of a 10 ohm cable resistance, the problem may be cleared on the surface by installing a new connector or a new indicator.

In table 1 the top "clean" state row is a file of five measured "MERIT" magnitudes from a known high quality meter. This data is used as reference. "MERIT" magnitudes measured in 4 different parameter fault states are introduced and compared with the corresponding "clean" state reference.

Merit "d" is a measure of the power dissipation component of sensor current $i_s$. It is measured using an electrical tool called coherent rectifier connected as shown in FIG. 1. The "clean" measured merit magnitude is 13.1 $\mu$A. It is assigned Reliability Factor (R.F.) =.98, meaning that our experience and our measurements point to this as a fine Sea Clip. It is expected to perform as required dependably, and accurately for over a year, even if buried or submerged in the ocean. This sensor is in a "clean" state.

Experience amd measurements are available in this and other reference and fault files.

Merit "j" in table 1 is a measure of the reactive component of sensor current $i_s$. It is measured using an electrical tool called an average responsive Fluke 83 III meter connected as shown in FIG. 1. The "clean" state file merit measurement magnitude is 7.5 mV rms. As with merit "d", this merit "j" is assigned the R.F.=.98 as a result of our experience* and specific measurements* on the Sea Clip.

Merit "S" is related to sensor "squareness", i.e., the peak to average ratio of sensor current $i_s$. An electrical tool responsive—at least in part—to the sharp spike shown in its waveform FIG. 2 is the true rms reading Fluke 87 III. This is connected as "j" was in FIG. 1. When in a "clean" state, the reading is 12.6 mV rms true. It is divided by the above "j" average rms reading 7.5 mV to get the merit=1.68.

Again, as in "d" or "j", this is assigned R.F.=.98 in light of general experience* and specific measurements* of the parameters and merits of this particular 6" MER Sea Clip.

Merit "$\rho V_o$" is the transfer resistance of this DC Swain Meter tested as shown in FIG. 3. It was discovered that shunt current $I_p$ did not flow into the sensor as expected, but instead flowed through the inverter and into input resistor $R_s$ to develop voltage $V_s$ which is amplified by gain $A_v$ to become Swain Meter output $V_o$. Merit $\rho V_o$ is simply $V_o$ divided by $I_p$.

Moreover, it was discovered that a current $I_s$ flowed from the sensor to the inverter and $R_s$, adding to the current $I_{R_s}$ flowing in $R_s$, so that $I_{R_s}$ generally is greater than $I_p$.

As before, file of $$\rho V_o = \frac{1.156 \text{ V}}{1 \text{ mA}}$$

is assigned R.F.=.98 in light of general experience* and measurements* on this particular 6" MER Sea Clip.

Merit $\beta$ is the ratio of average sensor current $I_s$ divided by shunt current $I_p$ used for testing as shown in FIG. 3. There are at least two ways to get a measure of $I_s$.

Merit "$\rho V_o$" can be used. The output $V_o$ is 1.156 V when $I_p$ is injected at 1 mA as in FIG. 3. Since $$V_s = \frac{V_o}{A_v},$$

and since $V_s = R_s I_{R_s}$, the current in $R_s$—namely $I_{R_s}$ is:

$$I_{R_s} = \frac{V_o}{A_v R_s}.$$

When we have confidence in the file values of $$A_V \left(10\frac{V}{V}\right) \text{ and } R_S \text{ (110}\Omega\text{)},$$

$I_{R_s}$ is 1.05 mA.

Since a known $I_p$=1 mA was injected, and also since $I_s$ is the difference between $I_{R_s}$ and $I_p$, $I_s$=0.5 mA. So $\beta$=0.5 for the "clean" setup used as reference.

"Clean" Reliability Estimate (R.E.)

The five different "mclean" state types of merit magnitude were each assigned reliability factor (R.F.)=.98 because comparison with file data shows that the clip, cable and indicator are all high quality components of this particular Swain Meter. The product of all is a better basis for a reliability estimate. This will be seen when the effects of 3 types of fault state in table 1 are reviewed later.

The reliability estimate (R.E.) for this Swain Meter in the "clean" state is assigned the same value as the product of all five R.F.s. This need not be so. Experience may later show that R.E. should be greater or lesser than the product of all R.F.'s. Experience may also show that one particular R.F. must be given greater weight than the others. Thus:

$$\text{R.E.}\cdots_{clean''} = R.F._d \cdot R.F._j \cdot R.F._S \cdot R.F._{\rho V_o} \cdot R.F._\beta = .98 \cdot .98 \cdot .98 \cdot .98 \cdot .98$$

$$\text{R.E.}\cdots_{clean''} = .98$$

I have defined R.E. as the likelihood that this Swain Meter will dependably measure direct current flowing in its' aperture to within ±7% for a year while the sensor is buried in earth (or used on the top surface.) Table 1 is for a 6" Sea Clip. For burial we prefer the simpler and smaller 6" Sea Clamp. The indicator is expected to be in a sheltered environment (like an office or wheelhouse.)

Subsea sensor burial for a year may be more severe. I estimate that this reliability estimate is the underground R.E. raised to the 1.5 power. In other words:

$$\text{R.E.}\bigg|_{\text{Subsea}} = \text{R.E.}\bigg|_{\text{Underground}}^{1.5}$$

For the "clean" Swain Meter in Table 1, where $$\text{R.E.}_{\text{underground} \atop \text{clean}}$$

is 0.9, the subsea value is $$\text{R.E.}\bigg|_{\text{Subsea} \atop \text{clean}} = 0.9^{1.5} = 0.85$$

I take this to mean that if ten "clean" sensors with indicators as in table 1 are used subsea to measure 1.8 Amp for 1 year, eight or nine (8.5) will dependably do so within ±5%. Only one or two (1.5) will fail or have excess error.

Reliability Estimate—"clean"

The reliability estimate for a "clean" D.C. Swain Meter in table 1 is 0.9 for ±5% accuracy for 1 year buried underground. Subsea is 0.85. I support the estimate that 9 out of 10 DC Swain Meter apparatus will be good after the sensor was buried for a year:
a) Thirty two inch (32") MER Sea clamps—three of them— were buried over a year ago. The customer says "we are satisfied". "I think the MER is much more reliable."
"Reliable"—"a . . . thing that can be counted upon to do what is expected . . . dependable. . ." This is what Webster says, and I think what our customer meant. We use the word "reliable" in this sense.
b) A five inch (5") clip was practically in spec. after years of use by divers.
c) A 13" clamp was cracked during subsea use but was still nearly in spec. despite sea water intrusion.
d) We hear of Swain Meters still working fine after 10 years. Premature failure in normal service is almost unheard of
e) About 3 years ago we put an unprotected (no epoxy or waterproofing) five inch (5") clamp in a container of Gulf of Mexico water. It was still accurate and stable after 1000 days in salt water.
Periodic tests—wet and dry showed some physical and electrical parameter change—increased equivalent of dissipation "d", and other merit degradation.
But despite this, measurements showed modest, steady change—no erratic or jumpy behavior. The 5" clamp was nearly in spec after 1000 days immersion.
f) The sensor—the part that is buried—is intrinsically stable and tough. The sensor works well even after damage has caused significant parameter change.
It resembles a split core transformer with excellent steel supported on an aluminum frame, and wound over with tape and fine copper magnet wire. Layers of protection include inert supports, tough tape and epoxy.
g) The indicator is carefully built with fine materials. The conservative design is based on years of experience. It is stable and accurate.
h) For burial, we typically use Sea Con WPC-2 connectors and 16/4 SOWA cable between the topside indicator and the buried sensor. The indicator can usually be in an office or wheelhouse environment because the cable can generally be at least 500 ft. long.

Accuracy

Typical accuracy of a "clean" MER meter type DC Swain Meter is ±1% of reading ±3 digits ± zero offset due to magnetism, either the Earth's, or a local magnetized sector (for example on a pipe) near the sensor.

When measuring a small current with a large sensor the zero offset due to magnetism can be the greater source of error. However, if all the current of interest can be interrupted this is of no consequence. Accuracy is then ±1% of reading, ±3 digits.

To measure 1.8 Amp we use the 2 Amp full scale range. 0.1% of reading is 2 mA. Then ±3 digits is ±3 milliperes (mA) or 0.2% of 1.8 Amp.

A clean 6 inch inside diameter aperture MER Sea Clip has an Earth Field Effect ($H_e$) rating of 0±60 mA equivalent input current maximum zero offset. Many sensors are better. So typically the Earth's magnetic field will throw the zero off by 40 mA. This is 2% of 1.8 Amp.

Assuming the Sea Clamp™ sensor is mounted on 4 inch steel pipe which has been inspected by a magnetic flow detector the clamp could have an additional 40 mA error due to zero offset, i.e., 2% more at 1.8 Amp.

So the "clean" Swain Meter reading can be in error by 0.1%+0.2%+2%+2% or 4.3% of 1.8 Amp.

This becomes just 0.3% if the 1.8 A can be interrupted (switched on and off), and if this is the only current of interest.

For measuring 18 Amp we use the 20 Amp range. Here 0.1% of reading is 18 mA. Also ±3 digits is ±30 mA. If the "clean" zero offset error due to $H_e$ remains at 40 mA; and if also the zero offset error due to local magnetism is still an additional 40 mA, the "clean" error in measuring 18 Amp can be "clean" error=0.18 A+0.3 A+0.4 A+0.4 A=

.128 Amp=

0.7% of 18 Amp measured

The percentage error is even less if the current is interrupted, or if the measured current is 180 Amp.

Gain

Calibration of the indicator SN 2517 in table 1 was to another MER Sea Clip, so the "clean" signal gain g (sensitivity) with 6" MER Sea Clip #235 on the 2 Amp and 20 Amp full scale ranges are:

$$g_{2A} = \frac{.968 \text{ Volts output}(V_o)}{1.0 \text{ Amp input}(I_i)}; \text{ and}$$

$$g_{20A} = \frac{.970 \text{ Volts output}(V_o)}{10 \text{ Amp input}(I_i)}; \text{ "clean"}$$

These gains are filed for use as reference values.

Fault

Three types of fault are shown in table 1: "Gap", "Short", and $R_{cable}$ up (10 or 20 ohms). When there is a significant fault the Swain Meter is no longer called "clean."

The "clean" and the three faults rows can be viewed in at least 2 ways:

A row represents the sort of merit measurements which may be had when a Swain Meter is tested; and/or A row represents a fault file, i.e., a reference file of merit magnitudes—either in a computer or on paper—showing merit measurements found in Swain Meters having a particular parameter fault in a specific part of the Swain Meter. These reference file merit magnitudes are later compared—either by hand or using a computer program generally following the methods shown herein—compared with merit measurement magnitudes found on a gaged ammeter, i.e., a Swain Meter under test—and used to get a reliability estimate, fault location and fault assessment.

Each of the five Merits change when a fault changes a parameter, but by no means equally. The example in Table 1 illustrates how we find out which parameter likely changed, and whether it is likely the sensor, cable, or indicator wherein an important parameter change has caused a significant merit change. The "Rgage Spreadsheet™" shown as Table 1 is also an example used to illustrate how to find a reliability estimate (R.E.) for a specific fault situation—either "manually" i.e., by "hand", or by a computer processor programmed to use pretty much the same method.

These three types of fault state will be considered separately. Representative fault merit magnitudes are placed in the fault file, to compare with newly measured merits so that reliability estimate can be made, fault located, and fault appraised. Other types, or combinations, may be found, but these three point to the way to handle a lot of possible damage events.

Gap

A diver or ROV may use a 6" MER Sea Clip sensor to measure 1.8 Ampere direct current flowing in a steel pipe under the sea. If the lips are fouled by an oyster there can be a nose gap of 5/16". This damage is the first example of a parameter fault. The clip is in a gap fault state. The parameter named magnetic reluctance is greatly increased by the air gaps at the lips of the fine magnetic core of the sensor made using very low magnetic reluctance steel.

The oyster damage has made a "gap" fault which has changed (for the worse) the reluctance parameter. As a consequence, the magnitude of all five Merit's changes.

The measure of gap fault merit "d" increases to 17.3 μA from the "clean" measure of 13.1 μA. Since more μA is worse, we compare the fault merit measure with the clean merit measure by dividing "clean" Reference (Ref.) by fault to get the ratio:

$$\frac{Ref. \text{``}d\text{''}}{Gap \text{``}d\text{''}} = \frac{13.1 \text{ μA}}{17.3 \text{ μA}} = .76 = \text{result of comparison}$$

The reliability factor (R.F.) for this particular merit is the result of comparison with file values. It is multiplied by the corresponding "clean" R.F. Thus, for merit "d" with gap the reliability factor is:

$$R.F._{d(gap)}=.76*.98=$$
$$.74$$

The measure of each merit is treated the same way. With the oyster damage induced gap, the reliability factors for each merit (plus R.E., gain factor, and zero offset) in table 1 are:

| Merit | "d" | "j" | "S" | "$\rho_{Vo}$" | "β" | Subsea Reliability Estimate | Gain at 2 A | Zero offset |
|---|---|---|---|---|---|---|---|---|
| R.F. | .74 | .52 | .74 | .95 | .62 | .07 | .98 | -.14 A |

The "j" reliability factor is the least i.e., the measure of the reactive component of sensor current $i_s$ (See FIG. 1) is the most sensitive indicator of a gap. No other fault in table 1 causes such a great change in merit "j".

The fault has been located in the lips of the sensor clip. So the diver or ROV is asked to check the sensor lips and see if they are closing properly. Hopefully the oyster is cleared out of the lips—the gap is closed—and the Swain Meter is restored to "clean" parameter condition.

If not, and the gap fault persists as in table 1, the question is what is our assessment of the fault? How serious is the damage? What is the impact of the fault on accuracy? Can any measure of input current be trusted at all? The answer is that I do not know for sure, but it is likely that:

A) Since the subsea reliability is only 0.7, we expect only one of ten Swain Meters in this condition to give 5% accuracy for a year. The zero offset error (sort of a happenstance reading) is shown as .14 A, or 8% of 1.8 Amp. But fortuitous sensor positioning could reduce this zero offset to only 0.4 A (or an unfortunate position could cause 0.3 Amp). It is possible that actual performance will be within 5%.

B) The gain has only increased 2% in the 2 Amp range (or dropped 3% in the 20 Amp range). So if the current we need to be measured can be interrupted, (switched on and off), then 5% data at 1.8 Amp can be had. Zero offset error is the big uncertainty, and it is removed by current interruption, assuming all currents of interest are interrupted.

C) Or the damage faulted Swain Meter can be used to measure 10 Amps or greater. Gain is expected to be good within ±3%, and even if the zero offset error is 0.2 Amp, the likely measurement is within ±5% of 10 Amp.

Short

The partial "short" of the sensor can be studied in a way similar to that shown above for "gap".

When the sensor's loss parameter is damaged by shorting a 4 inch diameter 10 turn coil positioned near the nose lips of a 6 inch diameter MER Sea Clip, the five measured Merits become different from the "clean" set here used as reference.

In table 1 it is evident that sensor loss parameter damage by short especially impacts merit "d". The "short" row states Reliability Factor (R.F.) plus gain and zero as:

| Parameter Fault | "d" | "j" | "S" | "$\rho_{Vo}$" | "β" | Subsea Reliability Estimate | Gain at 2 A | Zero offset |
|---|---|---|---|---|---|---|---|---|
| "Short" | | | | | | | | |
| R.F. | .50 | .75 | .780 | .98 | .91 | .13 | .997 | +55 mA |

The actual measurement of "d" as in FIG. 1 was 25.9 PA. In the example of table 1, I chose the "clean" reference merit file. There "clean" merit "d" is 13.1 PA. "Clean" reliability factor "d" is assigned .98 based on our general experience file and a review of a lot of merit and other data on file for 6" MER Sea Clip #235 with AutoMer indicator SN 2517, and others.

To get the shorted RF we use the ratio of "d" merits:

$$\frac{13.1 \text{ μA}}{25.9 \text{ μA}} = .51$$

This multiplied by 0.98 is 0.50—the reliability factor "short".

There are at least two possible uses for the R.F. data in the "short" row of table 1:
a) In testing an unknown Swain Meter the R.F. data points toward a dissipation fault resembling a partial sensor short; but not conclusively. Merits $\rho_{V_o}$ and β must be considered to rule out a high resistance cable parameter fault. Here "points toward" and "considered" means that the data—in either merit or R.F. form—is compared with related data in a clean reference file or fault file. Or,
b) Since the "short" row merit data was obtained when the sensor dissipation parameter was considerably increased by a deliberate fault—a partial short—this data can be placed in a fault file (manually on paper; or electronically, in a computer) together with annotation that the sensor was "shorted", i.e., not "clean".

The subsea Reliability Estimate of 0.13 (often Swain Meters, only one is likely to hold 5% accuracy for a year) is supported by comparison with our experience file showing that a partial short is likely to get worse during a year's exposure to a pipeline environment—especially a salt water marine environment.

Fault location of the partial short damage is aided by fault file statements that the dissipative fault is likely subsea—an abraded sensor or torn cable insulation. But it can be in a surface cable crushed by rock, or even a defective indicator.

Fault assessment of the likely effect of damage on accuracy is partly based on fault file statements that (see table 1, "short" row) the gain on the 2 Amp range is .997, i.e., down 0.3%; and the 20 A range gain is 1.003, i.e., up .3%. Then the gain is stable, well within 5%, even with the "short" fault.

The fault file shows a zero offset error of +55 mA due to the short, but with annotation that this can vary greatly. Also, this 55 mA is about the same as the 50 mA peak zero offset $H_e$ (Earth magnetic field) rating for a 6" MER Clip.

Further, calculation (by hand or computer) shows that 55 mA zero offset error is 3% of 1.8 Amp.

All in all, 5% Swain Meter apparatus accuracy with this "short" fault appears more likely than not; but the file says our confidence in this assessment should be guarded.

And, as noted under Reliability Estimate, the fault may get worse—maybe in less than a year.

A) above is a reminder that the reliability gage machine should use the whole Rgage Spreadsheet (for example, table 1) (and/or computerized file equivalent) and should be consulted for best available confidence in Reliability Estimate, fault location, and fault assessment of an unknown Swain Meter apparatus.

The "short" Reliability Factor (R.F.) for merit "d" is a lot lower than the other four R.F.s in the "short" row. But the parameter fault "$R_{cable}$ increased by 20 ohms" results in "d" RF=.41—still less than for the "short". How to tell whether the faulted parameter is damaged by a partial short, or instead the cable has the fault of too much resistance?

To reply, the Reliability Gage Machine (Rgage™) compares all five merit measurements in the "short" row (or the R.F.'s derived therefrom) with corresponding merits in the "clean" reference file and also with corresponding merits in the fault file—all four faults.

It is found that the studied unknown Swain Meter checks out at R.F.=.98 for merit $\rho_{V_o}$. The fault file shows R.F. of $\rho_{V_o}$=about .98 for a "short", but, in contrast: In the "20 ohm cable" file this same merit $\rho_{V_o}$ has R.F.=.43. This is a large difference, so the decision is that the fault being studied is a partial short.

A similar process is used in studying other faults.

Fault Location

The Swain Meter example of an Rgage Spreadsheet shown in table 1 can be used to illustrate an Rgage™ machine for fault location (plus Reliability Estimate and fault assessment.)

Electrical tools are connected as shown in FIGS. 1, 2, 3, and possibly FIG. 4, with outputs to a computer processor programmed (having software) to initially conduct "clean" and fault file reference library forming tests on apparatus comprising AutoMer SN 2517 using a cable to 6" MER Sea Clip #235. The computer compiles the merit magnitude test results, normalized, filed, and displayed as in table 1 so that the user can monitor progress.

Thus a library is made available, complete with "clean" reference file and fault file, with processor and programming so contents are readily accessed and monitored.

An unknown apparatus, SN #X similar to SN 2517 and all, needs to be evaluated. SN #X is connected to the Rgage machine as was SN 2517 and all, but this time the computer processor is shifted to the find fault location sub routine. Instead of filing the normalized test results as a "clean" or fault file, they are arranged for comparison with the existing "clean" and fault file. This is illustrated in the example, table 2.

Table 2 is a condensed form of the computer merit array for comparison with files to locate the fault in SN #X. The first location step is to classify the fault as one of the three in table 2.

The fault structure in SN #X is unknown. We have had no access to SN #X when it was "clean", so no "clean" reference ratio of merit measurements is possible. No Reliability Factor can be found based on merit data from SN #X only.

Measured merit data for SN #X is compared with computer file data—"clean" reference. The computer finds no fit at all convincing. SN #X is most likely not "clean".

SN #X measured merit row does not fit fault file "GAP" from SN 2517, especially at merit "d". Dissipation "d" for SN #X is nearly double the 17.3 for "Gap", and the other merits do not correlate well either.

SN #X had merit "d" measured =30.8. This is within reason of both fault file "short" ("d"=25.9) and "20 ohm extra $R_{cable}$" (d=31.4). However merits $\rho_{V_o}$ and "β" differ greatly for faults "short" and "20 ohm extra $R_{cable}$". SN #X correlates fairly well with fault "short"

$$\left\{\rho_{V_o} = \frac{1.151}{1.160} \text{ and } "\beta" = \frac{.045}{.054}\right\}.$$

These are much different from fault "20 ohm extra $R_{cable}$" $\{\rho_{V_o}=2.66 \text{ and } \beta=1.43\}$.

Fault location is aided by knowing that SN #X has a "short" class fault—but not a series resistor in the sensor or cable line. The computer display shows that power is dissipated by a shunt load. This would be the case when some of the sensors' winding is shorted on itself It would also happen if metal clamps held the clamp and acted as shorted turns. And likewise for bare sensor winding wire, or bare cable wire or connector in salt water. And finally the computer shows that defective inverter parts in the indicator can act similarly.

The Rgage's computer has flagged the cable and connector as most likely, partly because it was programmed for salt water.

The machine user probably elects to swap out the indicator part of the apparatus. First, because it is the easiest. The Rgage machine shows no big change.

The cable and connectors are checked and torn insulation is found. With new cable, the Rgage outputs a set of merits (table 3) resembling the "clean" reference file set from "clean" SN 2517 and 6"#235. Apparently the fault in SN #X was sensor cable shunt loading due to bare cable in salt water.

The "unknown" fault of SN#X in table 2 was simulated by a real 1034 ohm fault resistor connected across the sensor. SN #X in table 2 was SN 2517 indicator and different 6" MER Sea Clip #242. Next we can file this and compare.

Fault Assessment

A machine to assess the likely accuracy of a damaged ammeter and its best use is illustrated with Rgage Spreadsheet, table 1 and related table 2. Table 3 is introduced here.

Effective assessment requires fault classification. Since this is the first step in fault location, the program begins the location routine.

For fault location, electrical tools are connected as shown in FIGS. 1, 2 and 3 and possibly FIG. 4 with outputs to a computer programmed (having software) to initially conduct clean and fault file reference library building tests on apparatus comprising AutoMer SN 2517 using a cable to 6" MER Sea Clip #235. The computer compiles the test library results, normalized, filed and displayed as in table 1 so that the user can monitor progress.

Thus a library is made available complete with "clean" reference file and fault file of merit magnitude. This with processor programming so that the contents are readily accessed and monitored. In addition there is provided a file of performance related to a variety of fault state types or classes.

Table 2 and the accompanying discussion shows that apparatus SN #X has a fault likely in the same class as "short"—i.e., a partial short of sensor winding, or other power dissipating damage which represents a shunt (not series) resistive load across the sensor cable.

The right hand sector of table 1 illustrates the performance file—a compilation of ammeter apparatus gain and zero offset errors associated with several different classes or types of fault state.

Apparatus SN #X is likely faulted "short" so the computer displays probable accuracy as a function of the magnitude of the current being measured.

Table 3a is an expression of table 1 in fault class "short". Signal gains are normalized by comparison with the "clean" measurements which are, as usual, used as reference. To get this file data the computer is additionally programmed to apply test currents to apparatus SN 2517 and record the output response for each fault class. This forms a performance file correlated with "clean" and fault class. Table 1 and expansion table 3a show what test conclusions are filed and displayed for fault class "short".

I am gratified to see that even when "shorted" the expected gain is within ±.3% of "clean". And the zero offset error is estimated at ±60 mA—just over the 0±50 mA $H_e$ spec for a 6" Clip.

Table 3b is the second model for programming the computer display so that the user can see likely accuracy as a function of current measured. Steady currents less than 1.8 Amp may well be incorrectly measured by more than 4% because of zero offset error. A shift of ±60 mA in 0.6 Amp is ±10% by itself.

Reliability

Apparatus SN #X has been classified as likely "short" in connection with table 2. SN 9X is shown as likely as accurate as "clean" ±4% or better for a current measurement of 1.8 Amp or more.

Yet table 1 puts the estimated 1 year underground reliability at .26—i.e., of ten tries, 2 or 3 will hold ±5%. Why so pessimistic?

I put forward this model for computer programming (software) because:

a) "Short"—a partial short circuit—is likely to get worse with time—especially if salts and water are present in the soil.

b) The "short" is a classification, not a firm finding of the real problem. For example; shorted turns on the sensor are in this class. So too is a cable with bare wire in salt water or squeezed by a rusty pipe.

And there are probably more. So it is prudent to predict likely loss of 5% accuracy in a year or less. The underground reliability estimate is left at .26.

Our experience is the basis for the subsea reliability estimate of underground to 1.5 power, i.e., 0.13.

Series Injection

The quality of some sensor parameters can also be judged by series injection of a stimulus voltage. This produces an output response, and can be more convenient. It is not fussy to a knowledge of $R_s$, and so can be more accurate. One example is shown in FIG. 5.

The basic merit for FIG. 5 is $$\frac{\delta V_o}{\delta V_L}.$$

As with merit "β", the interpretation leads to stating average sensor current $I_s$, but this time, per loop voltage $V_L$.

$I_s$ is evaluated two ways. First when $V_L$=0 and a signal input current $I_i$ is in the sensor aperture, a core magnetic state restoring current $I_s$ flows in core winding $N_s$, and also an inverter amplifier input $R_s$ shunted by $C_s$. So $I_s$ generates a voltage $V_s$ due to $I_s$.

Second, when $I_i$=zero and loop sensor voltage $V_L$ is injected, an average sensor current $I_s$ also flows, so this time amplifier input voltage $$V_s = I_s R_s$$

is due to $V_L$.

I compare the first and second when $V_s$ due to $I_i$, is equal to $V_L$. From this I get:

$$\frac{I_s \text{ due to } V_L}{I_s \text{ due to } I_i} = \text{Merit } \alpha = \frac{\frac{\delta V_o}{\delta V_L}}{A_V}, \text{ where } A_V = \frac{V_o}{V_s}$$

Table 1 has been modified to show merit α, and is presented as table 1a.

Using the "clean" parameter 6" MER Sea Clip, I put $V_L$=+0.2006 Volt in series with the $I_s$ loop as shown in FIG. 5. The output of the indicator $V_o$ went to +.17 Volt. So:

$$\frac{\delta V_o}{\delta V_L} = \frac{+.17 \text{ Volt}}{+.2006 \text{ Volt}} = .847 \frac{V}{V}$$

The equation for merit α is:

$$\text{Merit } \alpha = \frac{\frac{\delta V_o}{\delta V_L}}{A_V}$$

Since $A_V$=10 in SN 2517, "clean" merit α=0.85. This is less than merit α for the merit α corresponding to the various parameter faults in table 1a.

When merit α is diminished in magnitude, the parameters of the sensor, cable and indicator are likely of higher quality, i.e., more reliable. "Smaller is better"—both in merit α and merit β.

There is a similarity between α and β. β is sort of a positive feedback factor, and so is α. But to get α it is not necessary to:

a) know $R_s$ b) subtract two similar numbers to get a result; so

I estimate α is more accurate and simpler to calculate.

AC Rgage™

A reliability gage machine can be made for a non-contact alternating current ammeter. The basic outputs are several kinds of merit which show the value of several parameters of the sensor, cable, and indicator. From comparing these merits with reference merit magnitudes come Reliability Factors, which are combined and processed, perhaps with weighting, to get a Reliability Estimate.

An example of a Reliability Gage for alternating current (AC Rgage) is diagrammed in FIG. 6. It is a series stimulus voltage injection form. A parallel current injection form is shown in FIG. 7.

There are many other processes for making an Rgage machine. A simple form is to pull the sensor connector and measure the total resistance $\Sigma r_S$. This is merit $\Sigma r_S$.

A customer buried Swain Meter sensors, each having a small auxiliary input linking the core as shown in FIG. 8. This has the advantage of showing how well the ammeter functions despite a faulted parameter. The merit $$\rho_o = \frac{v_o}{i_i}$$

is similar to the ammeter gain for the desired signal.

AC Rgage Spreadsheet—Table 4

Table 4 illustrates an example of a process for making a machine for finding and outputting a Reliability Estimate for and apparatus measuring or controlling alternating current. Table 4 also illustrates an example of a process for locating a parameter fault and assessing the damage done to the ammeter apparatus accuracy.

Three types of merit are shown in table 4 based on the merit measurers outlined in FIGS. 6, 7, and 8. It is apparent that others can be constructed. An elementary example is to disconnect the cable from the indicator and measure the total DC resistance $\Sigma r_s$ in FIG. 6. Table 4 is intended to illustrate the machine process together with the function of accompanying software. Table 4 is not intended to be all inclusive.

Reliability Estimate

An example illustrating a process for making an Rgage machine is table 4 supported by FIGS. 6, 7, and 8.

FIG. 7 is not shown in table 4. In a specific machine, shunt current stimulus injection can contribute needed precision for outputting reliability, fault location, and fault assessment. FIGS. 6 and 8 are sufficient to illustrate the electrical tools and interconnections needed to measure merits indicative of Swain Meter apparatus parameters. With table 4, the comparing and processing required of the computer and its software is illustrated so that the method for making an Rgage is shown.

In table 4, each "clean" merit is assigned Reliability Factor (RF)=.98. I teach this for writing in the computer reference file because our experience is good. Typical Swain Meters—especially the sensors—perform close to or within specification after considerable stress—bending, immersion in salt water, long cable to indicator, etc. Especially the MER sensors and indicators.

The cable and indicator also enjoy a reputation for being reliable over years of time.

The product of the three "clean" R.F.'s is .94. The Rgage's computer should be taught to look for at least five R.F.'s (as in table 1), so here in table 4 the process includes an allowance multiplier of .96.

Then until experience teaches better, the Reliability Estimate is the product of R.F.'s times the allowance. So Reliability Estimate to be outputted by the Rgage machine is 0.90 for this "clean" AC Swain Meter.

For now I know of no better process for estimating fault reliability than that illustrated in table 4. For example:

Gap

When the sensor is tested as in FIGS. 6 and 8 using the tools and automatic sequencing with merit measurement comparison shown in table 4, an early result is several Reliability Factors based on merit measurements.

Merit $Z_s$

Sensor impedance merit $Z_s$ can be measured using electrical tools arranged as illustrated in the example, FIG. 6. The air gap in the sensor core (⁵⁄₁₆" at the nose lips) sharply increases the reluctance of the core, so the inductance is considerably reduced. Since most of the sensor impedance $Z_s$ results from its inductance, $Z_s$ is down.

Table 4, under merit $Z_s$ shows that the measured average impedance is 140 ohms at 216.7 Hz square wave. This gap $Z_s$ is down from reference "clean"

$$Z_s = 460 \frac{mV_s}{mA_s}$$

(460 ohms). Thus the ratio:

$$\frac{Z_s(gap)}{Z_s(clean)} = .4$$

This is the fault/reference ratio in Table 4. For now, I recommend programming the Rgage machine computer to calculate this 0.4 fault to reference ratio, multiply by "clean" R.F.=.98, and post gap R.F.=.39.

Merit $A_L$

Sensor transfer voltage ratio $$A_L = \frac{v_o}{v_L}$$

shown in FIG. 6 is the ratio of the indicator amplifier output $v_o$ divided by the stimulus loop voltage $v_L$ injected in series with sensor loop to amplifier input $v_e$.

In this illustrative example, loop voltage $v_L$ is a 0.43 volt rms average; 216.7 Hz square wave at a transformer source resistance much less than its 50 ohm termination.

Amplifier input error voltage $v_e$ is nearly zero, so most of $v_L$ appears across the sensor winding $N_s$. Its current $i_s$ is roughly $$\frac{v_L}{Z_s}.$$

This sensor current $i_s$ flows in resistor $R_F$, so the output $v_o$ is $i_s R_F$.

Therefore a high impedance sensor (merit $Z_s$ is large) causes merit $$A_L = \frac{v_o}{v_L}$$

to be less. So for merit $A_L$, less is better—to a point.

Note that the indicators amplifier must function. If the amplifier is open, the error $v_e$ will increase and $i_s$ will fall. Output $v_o$ will be in phase with $v_L$.

An improved Rgage will include phase comparison of $v_o$ and $v_L$ to be sure they are opposite. And also amplifier transfer resistance merit $$\frac{v_o}{i_s}.$$

This will be compared by the computer with the reference file value of $R_F$=100 ohms. If $$\frac{v_o}{i_s}$$

is either much more or much less than 100 ohms, the computer will output a low Reliability Factor.

In table 4 under merit $$A_L = \frac{v_o}{v_L}$$

the gap $A_L$ is 407

$$\frac{\text{millivolts } v_o}{\text{volts } v_L}.$$

This is up from "clean" merit $$A_L = 196 \frac{mv_o}{A_L}.$$

Because more is bad, the computer processor will divide 196 by 407 to show reference/fault ratio=.48. When multiplied by file "clean" RF=.98 the computer posts $A_L$ gap R.F.=.47.
Merit $\rho_o$ Signal transfer resistance merit $$\rho_o = \frac{v_o}{i_i}$$

is shown in illustrative example FIG. 8. Generally this amounts to the Rgage machine measuring the normal operation of the ammeter apparatus using an auxiliary input winding on the sensors core.

The auxiliary input current $i_i$ is the product of the 216.5 Hz square wave 11 milliamperes rms average current multiplied by the number of turns ($N_i$=100) in which it flows. Thus $i_i$ is entered in the computer as 1.1 Amp. The "clean" output $v_o$ is 91.3 millivolts rms average. Thus "clean" merit $$\rho_o = \frac{v_o}{i_i} = \frac{91.3 \text{ mv}}{1.1 \text{ A}} = \frac{83 \text{ mv}_o}{\text{Amp } i_i},$$

when $R_{i_s}$=1.6 Ω.

This "clean" merit is assigned R.F.=.98 as before.
Gap $\rho_o$

The merit PO computed with the same ⁵⁄₁₆" nose gap fault is 83.2 mv/amp—just slightly above the reference "clean" $\rho_o$=83.0. Ratio computation is fault divided by reference because the usual fault reduces output $v_o$, i.e., $\rho_o$.

When the ratio exceeds .98, it is posted as .98. This is because for now, nothing is expected to be good for a year at rated occurrancy more often than 98 tries out of 100. This is conservative. Our experience appears better, but we are reluctant to advertise better until we have more data.
Gap Reliability Estimate The Reliability Factors (R.F.) entered for the gap fault are:
$Z_s$=.39
$A_L$=.47
$\rho_o$=.98

Table 4 shows, in this illustrative example, that the Rgage machine processor calculates the product of R.F.s as .18. The reference file shows an allowance for other factors .96, so Reliability Estimate is 0.17.

This is discussed later under Fault Assessment. Saying we estimate two of ten ammeters will be in spec for a year is conservative.
"Average and "rms"

I have spoken of "average" voltage, current, etc. FIGS. 6, 7, and 8 provide an example to illustrate an Rgage machine for an ammeter—Swain Meter type, or other. Suitable tools include the equivalent of a Fluke 83 III with added output for computer entry. This measures alternating current (or voltage) and shows the result as rms amperes. However, this is for a sine wave current. It is preferred for Rgage use because the result shown is really proportional to the "average" value of the waveform measured.

Here "average" readings typically better show merit error due to parameter degradation resulting from damage to a sensor, cable, or indicator labeled fault. True "rms" measurements tend to emphasize sharp transition "spike" currents. "Average" measurements generally better show square wave value.

Square wave injection or test signal current is used in illustrative example FIGS. 6, 7, and 8 because it may then be unnecessary to measure merits at several frequencies. Instead, the ratio of "average" divided by "rms" measurements can provide enough information. Here "rms" current (or voltage) is to be done with the equivalent of a Fluke 87 III plus readout suited for computer entry.

Typically square wave measurements at about 200 Hz show:

$$\frac{\text{"average"}}{\text{"rms"}} = 1.11.$$

For example, a square wave current measured in a Fluke 87 III can read 10 mA true "rms" but the same current in a Fluke 83 III will read 11 mA or so.
Fault Location In table 4, the gap merit $Z_s$ has the lowest Reliability Factor so the computer searches $Z_s$ first for a fault location clue. Under merit $Z_s$ the "clean" "average" to "rms" ratio is 1.093; i.e., close to the 1.11 expected for a square wave impedance. This is posted in the computers reference file.

In contrast, the "gap"

$$\left(\frac{\text{"av."}}{\text{"rms"}}\right)$$

is 0.98. This is a quick frequency response comparison. "Clean" has high "average" which goes with good low frequency response needed for square wave output. But gap fault has higher "rms" than "average". This is typical of fast transient spike type waveforms.

Comparison with file reference outputs likely fault is low sensor inductance, probably from a sensor lip gap. This points to the fault location.
Power Dissipating Short and Shunt Merit $Z_s$ is also depressed (lower R.F.) in Table 4 under Faults "short" and 1034 Ω "shunt". That these are different from a gap is shown by the $$\left(\frac{\text{"average"}}{\text{"rms"}}\right)$$

ratios—nearer the 1.11 expected of a square wave.

Thus the fault location software of the Rgage machine calls for several merit measurements, compares these with filed design and previous measurements, correlates faulted measurement waveforms and/or $$\left(\frac{\text{"av"}}{\text{"rms"}}\right)$$

ratios with corresponding filed measurements, and outputs the likely fault location.

Fault Assessment

Fault assessment provides an estimate of best use, i.e., of the present type of measurement error likely from the ammeter apparatus provided the fault conditions remain about the same. For example, if the earth is now frozen so digging up a buried sensor is impractical, can we now use at least part of the apparatus outputs? This may be a time to be a bit optimistic.

Gap

The 5/16" air gap in the nose lip of the 6" MER clip sensor in table 4 has Reliability Estimate (R.E.) equal to .18. This gap is a severe fault, when predicting the likelihood of near full spec accuracy a year later.

But surprisingly, merit $\rho_o$ shows that the transfer resistance $$\frac{v_o}{i_i}$$

is within 1% of reference for both gap and short faults. Thus the ammeters "gain" is accurate at 1 Amp full scale, where $R_F$=100 ohms. But what of more sensitive ranges, stray pickup and sensitivity to position or adjacent currents?

Reduced sensor inductance because of gap damage is likely more notable at low frequencies and high sensitivity. Therefore machine software should command measurement of merit $\rho_o$ when $R_F$=1000 or 10,000 ohms, i.e., when sensitivity is 0.1 or .01 Amp full scale. Gap $\rho_o$ may be down 5% at greater sensitivity.

Experience indicates that the usual 1 mA stray pickup can be increased by a gap by 3 to 10 times. So the recommended minimum current measurement is increased from perhaps 10 mA to about 100 mA.

With a gap, more care will be needed in positioning the conductor carrying the current to be measured fairly near the center of the sensors aperture. Otherwise, the transfer resistance may decrease.

In addition, the gap increases sensitivity to interfering or stray current flowing in adjacent conductors, especially near the lips.

The Rgage machine reference file is to be provided with this type of experience and instructions for special merit measurements. When interrogated, the computer outputs the gap fault assessment:

For now, as long as fault does not much change:

a) Ammeter apparatus measurements over 1 Amp are likely within 2% of reading.
b) Measurements over 0.1 Amp are likely within 5%.
c) Stray pickup, and adjacent current interference may reach 10 mA.
d) Place clip so that the conductor carrying the current to be measured is fairly well centered in clips aperture.

General Notes

The method outlined in table 4 can be used in general for estimating other faults reliability, and location, and assessing present accuracy.

Merit measurements are sensitive to the burden resistance $R_{i_s}$ of the ammeter used to measure sensor current $i_s$. Generally, the ammeter apparatus works better—especially under fault condition, if the total resistance in the sensor current loop is small—say less than 10 ohms. A high resistance cable ($r_{cable}$>5 ohms) also magnifies the error due to a fault.

Indicator fault can likely be found by comparing fault $$\frac{v_o}{i_s}$$

with File $R_F$. Much above or below indicates probable loss of accuracy.

Analysis of output $v_o$ waveform on the equivalent of an oscilloscope or wave analyzer can provide much additional merit data.

When testing is done at the same time the ammeter apparatus is measuring signal current, it can be necessary to provide coherent detection and/or phase lock loop tools to separate the merit measurements from the normal signal. And time sharing gated tools can be provided to delete the normal ammeter apparatus output when merit tests are being performed. It is likely that merit tests can be completed in a relatively short time.

I claim:

1. A Reliability gage coupled with a non-contact ammeter including a sensor and an indicator, said reliability gage including merit measuring means indicative of the quality of at least one parameter of said ammeter, and at least one merit magnitude reference, and means comparing and processing said merit measuring means and said merit magnitude reference coupled to means outputting at least one of said ammeter quality and estimated reliability, and fault location, and fault assessment for best use of said non-contact ammeter.

2. A Reliability gage coupled with a non-contact ammeter including a sensor and an indicator, and said reliability gage including merit measuring means including a series voltage $V_L$, at least one of AC and DC injected in series with the said sensor's current $i_s$ loop so that thereby the said sensor current $i_s$ flowing to the said indicator is changed proportionally with said $V_L$; and processing means with coupled merit output indicative of the quality of at least one parameter of said non-contact ammeter, and at least one merit magnitude reference indicative of at least one of a high quality and a fault state of said ammeter, and means including at least one of a person and a machine for comparing and processing said merit output and said merit magnitude reference coupled to means outputting at least one of said ammeter's quality, and estimated reliability, and fault location, and fault assessment for best use of said non-contact ammeter.

3. A Reliability gage coupled with a non-contact ammeter including a sensor and an indicator, said reliability gage including merit measuring means including a shunt current $i_p$, at least one of AC and DC, at least one of injected across the indicator terminals to the said sensor's winding $N_s$ via the cable and injected across said sensor winding $N_s$ so that thereby said indicator input current at least one of $i_{R_s}$ and $i_{R_i}$ is changed proportionally with said $i_p$; and processing means with coupled merit output indicative of the quality of at least one parameter of said non-contact ammeter, and at least one merit magnitude reference indicative of at least one of a merit and a fault state of said ammeter, and means comprising at least one of a person and a machine comparing and processing said merit output and said merit magnitude reference coupled to means outputting at least one of estimated reliability, and fault location, and fault assessment for best use of said non-contact ammeter.

4. A machine outputting at least one of quality, and estimated reliability, and fault location, and fault assessment for best use of a coupled non-contact ammeter for at least one of measuring and controlling electric current;

said machine also having at least one of merit measuring and processing means with coupled merit output indicative of the quality of at least one parameter of said ammeter, and reference means including at least one merit magnitude representative of at least one said merit output derived from said ammeter in a state at least one of "clean", that is to say, first rate, and fault by gap, and fault by short, and others; plus comparison and processing means comprising at least one of a person and a machine such that said at least one merit output is compared with said at least one merit magnitude, and the result processed such that said at least one of quality, and estimated reliability and fault location and fault assessment for best use are outputted.

5. A Reliability gage coupled to means outputting the state of a coupled non-contact ammeter having a sensor and an indicator, and also at least one of conductors directly joining said sensor to said indicator and a cable connecting said sensor to said indicator as either "ready", in a normal condition, at least to the first order, or as not ready, in other words, a fault exists in at least one of said sensor, and said indicator, and said conductors joining and said cable; said state output being at least one of binary, that is to say, either "ready" or otherwise not ready; and proportional, which is entirely "ready", mostly "ready", part "ready", entirely not "ready" with gradations in-between, and said reliability gage including combined parameter merit measuring means with coupled merit output indicative of the quality of at least two parameters of said non-contact ammeter, and at least two comparitors each with merit magnitude reference thresholds coupled to said means outputting.

6. A Reliability gage coupled with a non-contact ammeter having a sensor and an indicator, said reliability gage including dissipative "d" merit measurement means largely responsive to the power dissipating component of sensor current $i_s$ and processing means with coupled merit output indicative of the quality of at least one parameter of said non-contact ammeter, which includes at least one merit magnitude reference indicative of at least one of a quality and a fault state of said ammeter, and means comparing and processing said merit output and said merit magnitude reference coupled to means outputting, said means comparing and processing comprising at least one of a machine and a person, so as to output at least one of quality, and estimated reliability, and fault location, and fault assessment for best use of said non-contact ammeter.

7. A Reliability gage coupled with a non-contact ammeter having a sensor and an indicator, said reliability gage including reactive "j" merit measurement means largely responsive to the inductive component of said sensor's current $i_s$ and processing means with coupled merit output indicative of the quality of at least one parameter of said non-contact ammeter, which includes said sensor and at least one merit magnitude reference indicative of at least one of quality and a fault state of said ammeter, and means including at least one of a machine and a person comparing and processing said merit output and said merit magnitude reference coupled to means outputting at least one of quality, and estimated reliability, and fault location, and fault assessment for best use of said non-contact ammeter.

8. A Reliability gage as claimed in claim 1 wherein said merit measuring means include a peak to average "S" merit measurement largely responsive to the ratio of the peak magnitude of said sensor's current $i_s$ divided by the average magnitude of said sensor's current $i_s$; and also wherein said non-contact ammeter is a Swain Meter incorporating at least some of the teaching of U.S. Pat. No. 3,768,011.

9. A Reliability gage as claimed in claim 1 wherein said merit measuring means include a series voltage $V_L$, at least one of AC and DC injected in series with said sensor's current $i_s$ loop so that thereby the said sensor current $i_s$ flowing to the indicator is changed proportionally with said $V_L$.

10. A Reliability gage as claimed in claim 1 wherein said merit measuring means include a shunt current $i_p$, at least one of AC and DC, at least one of injected across the said indicator terminals to said sensor having a winding $N_s$ via the cable, and injected across said sensor winding $N_s$ so that thereby said indicator input current which is at least one of $i_{R_s}$ and $i_{R_i}$ is changed proportionally with said $i_p$.

11. A Reliability gage as claimed in claim 1 wherein said merit measuring means include a dissipative "d" merit measurement means largely responsive to the power dissipating component of said sensor's current $i_s$.

12. A Reliability gage as claimed in claim 1 wherein said merit measuring means include reactive "j" merit measurement means largely responsive to the inductive component of said sensor's current $i_s$.

13. A Reliability gage as claimed in claim 1 wherein said sensor has a core, and also wherein said indicator has an output $V_o$, and further, wherein said merit measuring means include means measuring merit $\rho_o$ which is the transfer resistance for at least one of alternating or direct current of said ammeter; that is to say, said merit $\rho_o$ is equal to said indicator voltage output $V_o$ divided by the input ampere turn product $i_i$ injected around said core by use of an auxiliary input winding around said core, together with means making said auxiliary winding available to said means measuring merit $\rho_o$.

14. A Reliability gage as claimed in claim 1 wherein said indicator is coupled to said sensor by at least one of a cable and a connector, and wherein said merit measuring means include means to measure the total resistance $\Sigma r_s$ merit which is the sum of the resistance $r_s$ of said sensor plus the resistance $r_{cable}$ of said cable together with the resistance of said connector.

15. A method for making a machine outputting at least one of estimated reliability, fault location, and fault assessment for best use of a non-contact ammeter having a sensor and an indicator and at least one of conductors directly connecting and a cable connecting said sensor and said indicator for at least one of measuring and controlling electric current comprising the steps:

a) connect at least one parameter merit measuring and processing means with coupled merit output with said sensor and said indicator;

b) generate at least one merit magnitude reference indicative of a fault state of said ammeter, and c) using at least one of a person and a machine d) compare and process said merit output with said merit magnitude reference to e) output at least one of a non-contact ammeter's quality and at least one reliability factor with suitable weight, and f) combine and process said at least one reliability factor to produce a reliability estimate coupled to means outputting, and g) to provide for fault location and fault assessment to generate an array of at least several said merit magnitudes each representative of a fault state of said ammeter, and h) array said at least one merit output in the equivalent of an Rgage spreadsheet together with said merit magnitudes, and i) operate on said spreadsheet contents, normalizing and comparing to find at least one of a non-contact ammeter's quality and an estimated fault state coupled to said means outputting, and j) to provide for fault assessment for best use add to said Rgage spreadsheet gain, zero offset and noise error characteristic of each said ammeter fault state, together with associated best uses, and k) combine, process and output with weighting said errors and best uses which correlate most closely with said estimated fault state.

16. A Reliability gage coupled with a non-contact ammeter, said reliability gage including means for measuring at least one merit of at least one part of said ammeter, plus merit magnitude reference means indicative of the quality of said part, together with means comparing, interpreting and outputting at least one of reliability, trustworthiness and fault location, all of said means comprising at least one of a person and a machine.

17. A method for making a machine outputting a measure of at least one of quality, and trustworthiness, and fault state for a coupled non-contact ammeter, comprising the steps:

a) provide coupled means including at least one of a person and a machine as follows:

b) said means including at least one for merit measuring having a merit output; and c) said means including merit magnitude reference having a reference output; and d) said means including outputting a comparison between said merit output and said merit magnitude reference, and e) said means including interpreting said comparison and outputting said measure of at least one of quality, and trustworthiness, and fault state.

* * * * *